(12) United States Patent
Cheng et al.

(10) Patent No.: US 12,144,065 B2
(45) Date of Patent: *Nov. 12, 2024

(54) WARPAGE CONTROL IN THE PACKAGING OF INTEGRATED CIRCUITS

(71) Applicant: Taiwan Semiconductor Manufacturing Co., Ltd., Hsinchu (TW)

(72) Inventors: Ming-Da Cheng, Taoyuan (TW); Hsiu-Jen Lin, Zhubei (TW); Cheng-Ting Chen, Taichung (TW); Wei-Yu Chen, Taipei (TW); Chien-Wei Lee, Xiushui Township (TW); Chung-Shi Liu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 146 days.

This patent is subject to a terminal disclaimer.

(21) Appl. No.: 17/869,384

(22) Filed: Jul. 20, 2022

(65) Prior Publication Data

US 2022/0361293 A1    Nov. 10, 2022

Related U.S. Application Data

(60) Division of application No. 16/599,959, filed on Oct. 11, 2019, now Pat. No. 11,432,372, which is a
(Continued)

(51) Int. Cl.
*B23K 3/08*        (2006.01)
*H01L 21/677*      (2006.01)
(Continued)

(52) U.S. Cl.
CPC .............. *H05B 3/02* (2013.01); *B23K 3/087* (2013.01); *H01L 21/67721* (2013.01);
(Continued)

(58) Field of Classification Search
None
See application file for complete search history.

(56) References Cited

U.S. PATENT DOCUMENTS 5,447,886 A    9/1995 Rai
5,802,856 A    9/1998 Schaper et al.
(Continued)

FOREIGN PATENT DOCUMENTS

CN    102386114 A    3/2012
TW    200605245      2/2006
(Continued)

*Primary Examiner* — Devang R Patel
(74) *Attorney, Agent, or Firm* — Slater Matsil, LLP

(57) ABSTRACT

A method includes placing a first package component over a vacuum boat, wherein the vacuum boat comprises a hole, and wherein the first package component covers the hole. A second package component is placed over the first package component, wherein solder regions are disposed between the first and the second package components. The hole is vacuumed, wherein the first package component is pressed by a pressure against the vacuum boat, and wherein the pressure is generated by a vacuum in the hole. When the vacuum in the hole is maintained, the solder regions are reflowed to bond the second package component to the first package component.

20 Claims, 6 Drawing Sheets

Related U.S. Application Data continuation of application No. 15/380,671, filed on Dec. 15, 2016, now Pat. No. 10,512,124, which is a division of application No. 13/559,318, filed on Jul. 26, 2012, now Pat. No. 9,538,582.

(51) Int. Cl.

| | |
|---|---|
| *H01L 21/68* | (2006.01) |
| *H01L 21/683* | (2006.01) |
| *H01L 23/00* | (2006.01) |
| *H05B 3/02* | (2006.01) |
| *B23K 101/40* | (2006.01) |

(52) U.S. Cl.
CPC .......... *H01L 21/68* (2013.01); *H01L 21/6838* (2013.01); *H01L 24/75* (2013.01); *H01L 24/81* (2013.01); *B23K 2101/40* (2018.08); *H01L 2224/131* (2013.01); *H01L 2224/16225* (2013.01); *H01L 2224/16227* (2013.01); *H01L 2224/75744* (2013.01); *H01L 2224/7598* (2013.01); *H01L 2224/81191* (2013.01); *H01L 2224/81815* (2013.01); *H01L 2224/97* (2013.01); *H01L 2924/3511* (2013.01); *H01L 2924/37001* (2013.01)

(56) References Cited

U.S. PATENT DOCUMENTS

| | | |
|---|---|---|
| 6,344,407 B1 | 2/2002 | Matsuki et al. |
| 6,364,196 B1 | 4/2002 | Wood et al. |
| 6,432,744 B1 | 8/2002 | Amador et al. |
| 6,834,158 B1 | 12/2004 | Templeton |
| 6,972,069 B2 | 12/2005 | Hecht et al. |
| 7,455,213 B2 | 11/2008 | Nishiyama |
| 7,612,386 B2 | 11/2009 | Ng et al. |
| 8,042,727 B2 | 10/2011 | Shirai et al. |
| 8,104,666 B1 | 1/2012 | Hwang et al. |
| 9,010,617 B2 | 4/2015 | Yu et al. |
| 2003/0047527 A1 | 3/2003 | Master et al. |
| 2005/0034302 A1 | 2/2005 | Hosotani et al. |
| 2006/0208041 A1 | 9/2006 | MacKay et al. |
| 2007/0141751 A1 | 6/2007 | Mistry et al. |
| 2008/0169282 A1 | 7/2008 | Sorabji et al. |
| 2009/0137084 A1 | 5/2009 | Kida |
| 2012/0018494 A1 | 1/2012 | Jang et al. |
| 2012/0175403 A1 | 7/2012 | Yu et al. |
| 2012/0291950 A1 | 11/2012 | Sugiyama et al. |

FOREIGN PATENT DOCUMENTS

| | | |
|---|---|---|
| TW | 200615074 | 5/2006 |
| TW | I258197 B | 7/2006 |
| TW | 201137994 A | 11/2011 |
| TW | 201230215 A | 7/2012 |
| TW | 201230260 A | 7/2012 |

WARPAGE CONTROL IN THE PACKAGING OF INTEGRATED CIRCUITS

PRIORITY CLAIM AND CROSS-REFERENCE

This application is a divisional of U.S. application Ser. No. 16/599,959, filed on Oct. 11, 2019, which is a continuation of U.S. application Ser. No. 15/380,671, filed on Dec. 15, 2016, now U.S. Pat. No. 10,512,124, issued on Dec. 17, 2019, which is a divisional of U.S. application Ser. No. 13/559,318, filed on Jul. 26, 2012, now U.S. Pat. No. 9,538,582 issued Jan. 3, 2017, which applications are incorporated herein by reference.

BACKGROUND

In the packaging of integrated circuits, device dies or packages are packaged onto package substrates, which include metal connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use materials that can be easily laminated. In addition, organic materials may be used as the dielectric materials of the package substrate. These materials, however, are prone to warpage caused by elevated temperatures used in the reflow of the solder. Furthermore, during the bonding process, since the device dies and the package substrates have significantly different Coefficients of Thermal Expansion (CTEs), the warpage in the dies and the package substrates is worsened. For example, the silicon in the device dies has a CTE close to about 3.2, while the package substrates may have a CTE between about 17 and 10, or even higher. The warpage in the package substrates may cause irregular joints and/or bump cracks. As a result, the yield of the packaging process is adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods for forming packages are provided in accordance with embodiments. The variations of the embodiments are discussed. Throughout the various views and illustrative embodiments, like reference numbers are used to designate like elements. It is appreciated that the embodiments such as what are shown in FIGS. 1A through 4 are exemplary embodiments, and more embodiments may be developed based on the teaching of the exemplary embodiments.

Figure 1A:
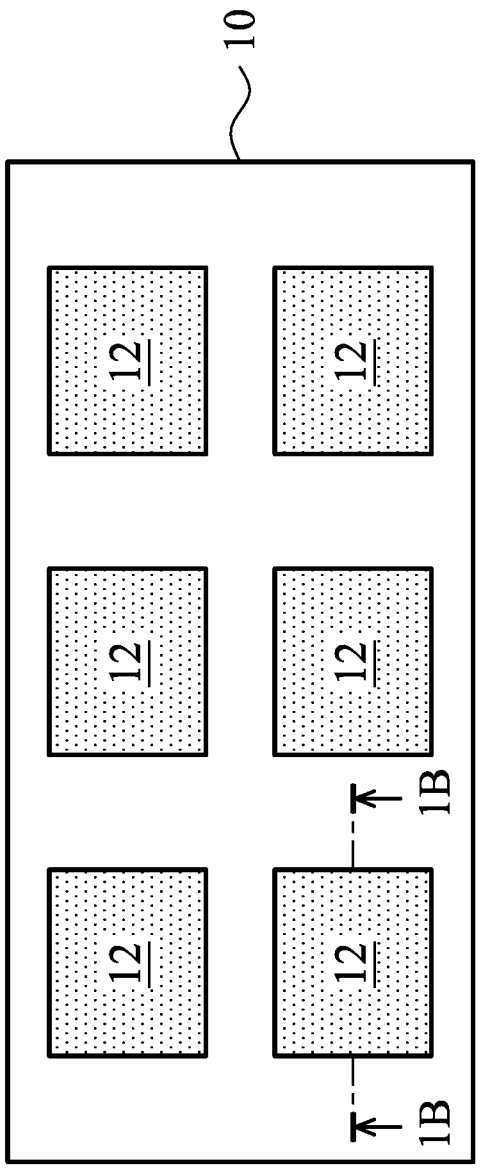
FIGS. 1A and 1B include a top view and a cross-sectional view of a package substrate strip in accordance with some embodiments.
Figure 1B:
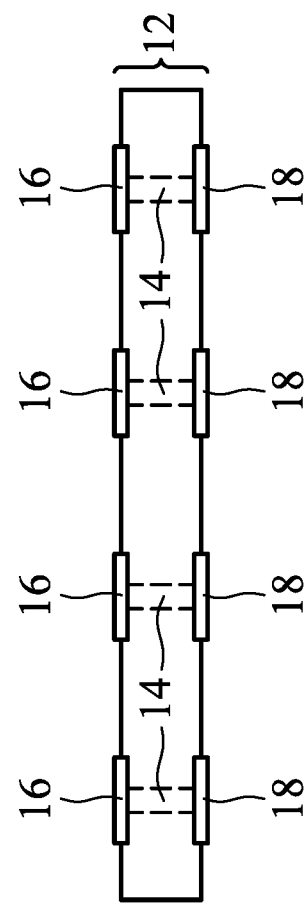

FIGS. 1A and 1B illustrate a top view and a cross-sectional view, respectively, of an exemplary package component 10, on which a bonding process in accordance with exemplary embodiments is performed. Package component 10 may be a package substrate strip, and hence is referred to as package substrate strip 10 hereinafter, although package component 10 may be another type of package component such as an interposer. Package substrates 12 may be laminate substrates, which include a plurality of dielectric films laminated together. In accordance with embodiments, package substrate strip 10 includes a plurality of package substrates 12 that are identical to each other. In some embodiments, package substrates 12 are distributed uniformly throughout package substrate strip 10, and may have a pattern of an array. In other embodiments, package substrates 12 are disposed as a plurality of groups, with the inter-group spacing between the groups greater than the inner-group spacing between package substrates 12 that are in the same group.

FIG. 1B schematically illustrates a cross-sectional view of one of package substrates 12, wherein the cross-sectional view is obtained from the plane crossing line 1B-1B in FIG. 1A. A plurality of connectors 16, which may be pre-solder regions, metal pads, or non-reflowable metal bumps, is formed on a side of package substrate 12. Metal features 16 are electrically coupled to metal features such as bond pads 18 on the opposite side of package substrate 12. Dashed lines 14 represent the electrical features that couple features 16 to features 18, wherein the electrical features may include a plurality of metal lines and vias that interconnect the metal lines.

Figure 2A:
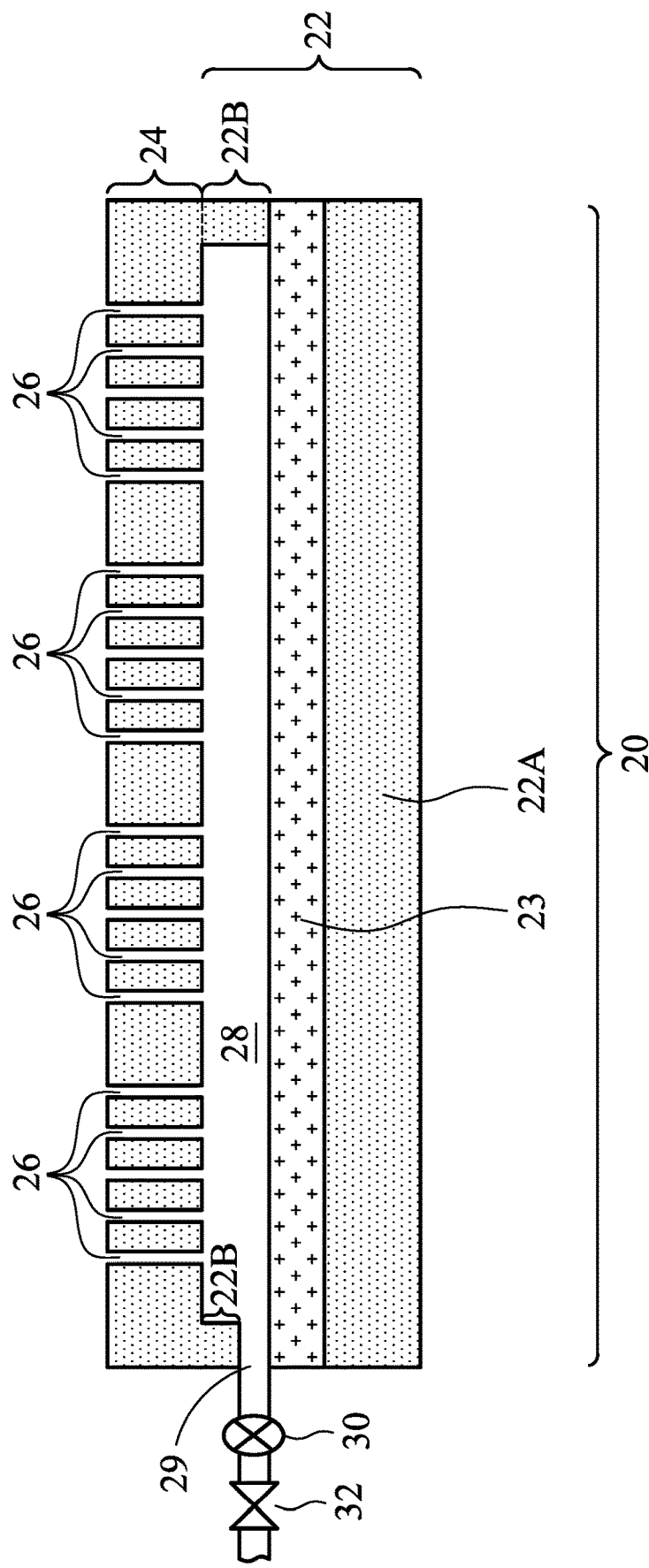
FIGS. 2A and 2B are cross-sectional views of exemplary vacuum boats in accordance with exemplary embodiments.
Figure 2B:
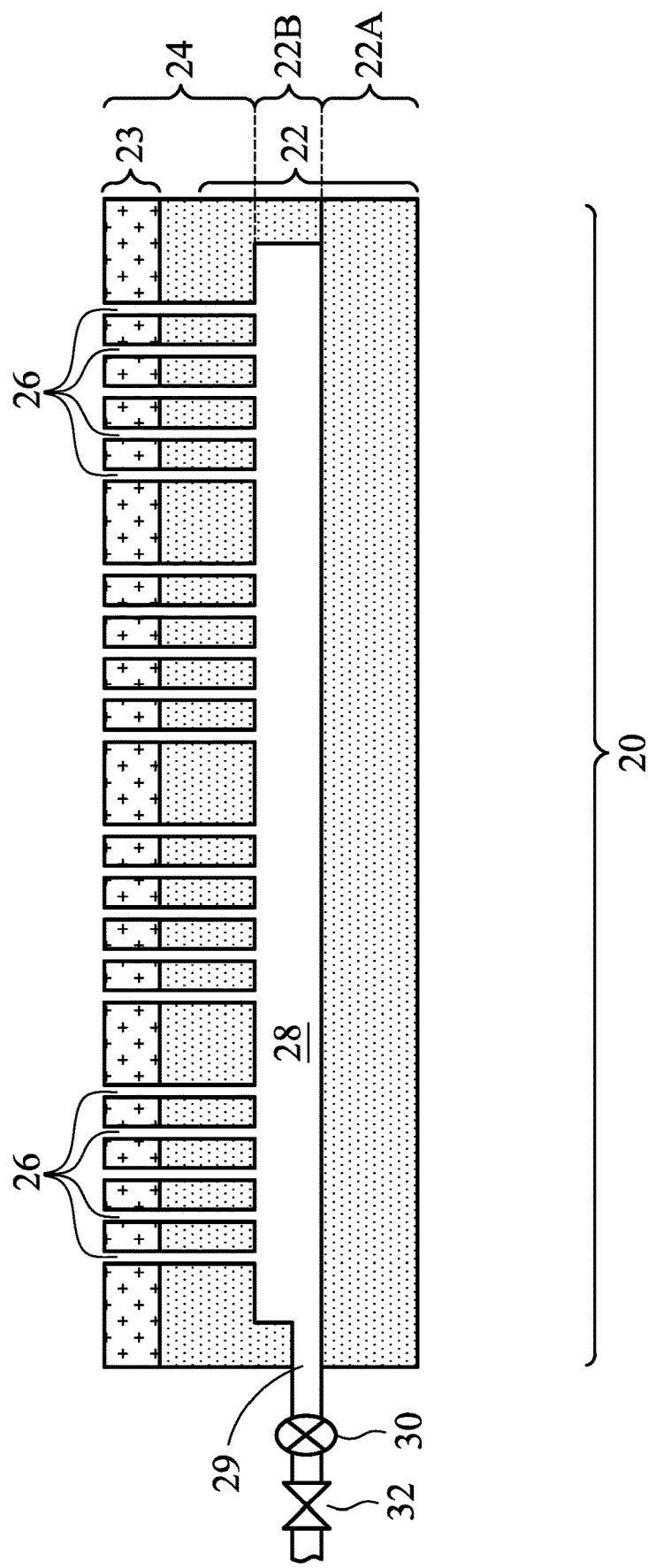

FIGS. 2A and 2B illustrate cross-sectional views of vacuum boat 20 in accordance with exemplary embodiments. Vacuum boat 20 includes base 22, which further includes lower portion 22A, upper portion 22B, and air-penetration layer 24 over and connected to upper portion 22B. Base portion 22A is underlying and overlapped by air-penetration layer 24, and is vertically spaced apart from air-penetration layer 24 by air passage 28, which is a space filled with air (or vacuumed). Base portion 22B forms a ring that encircles air passage 28. Furthermore, base portion 22B joins air-penetration layer 24 with no gap therebetween. Base 22 may be formed of non-porous materials that can effectively prevent air from penetrating through. Air passage 28 may have a shape that is similar to the top-view shape (such as a rectangular shape) of package substrate strip 10. In some exemplary embodiments, base portions 22A and 22B and air-penetration layer 24 are formed of a rigid material that is strong enough to maintain vacuum in air passage 28, so that vacuum boat 20 is not crushed by the vacuum. For example, base portions 22A and 22B and air-penetration layer 24 may be formed of a metal or a metal alloy including copper, aluminum, stainless steel, or the like. Alternatively, base portions 22A and 22B and air-penetration layer 24 are formed of a ceramic or ceramics.

Referring again to FIGS. 2A and 2B, base 22 may also include thermal insulation layer 23, which is formed of a thermal insulating material. Thermal conductivity of thermal insulation layer 23 may be lower than about 1 W/K·m, for example. Thermal insulation layer 23 may sustain the melting temperatures (or temperatures slightly higher) of solders without being damaged. For example, thermal insulation layer 23 is configured to sustain temperatures higher than about 200° C., or higher than about 230° C. In some exemplary embodiments, thermal insulation layer 23 is formed of Teflon.

Figure 4:
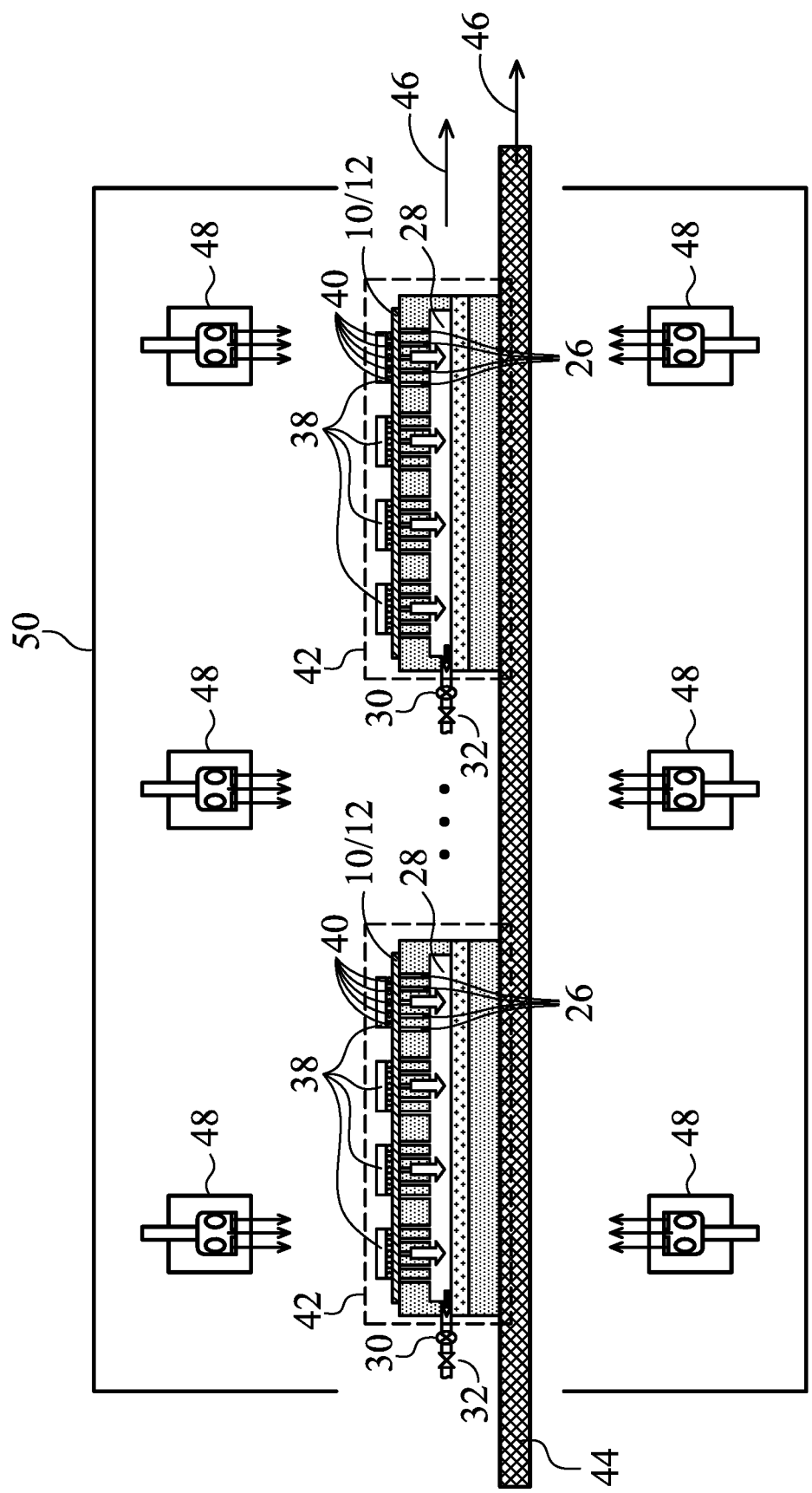
FIG. 4 illustrates a cross-sectional of a packaging process, wherein the vacuum boat and the package components that are to be bonded go through a reflow process.

Referring to FIG. 2A, thermal insulation layer 23 has the function of preventing the heat absorbed by air-penetration layer 24 to be conducted to base portion 22A during the reflow process shown in FIG. 4. If thermal insulation layer 23 is not included, base portion 22A, due to its large volume, may absorb too much heat during the reflow process in FIG. 4, and cause adverse reduction in the temperature of the package components 12 and 38 and solder regions 40 (FIG. 4).

Figure 3:
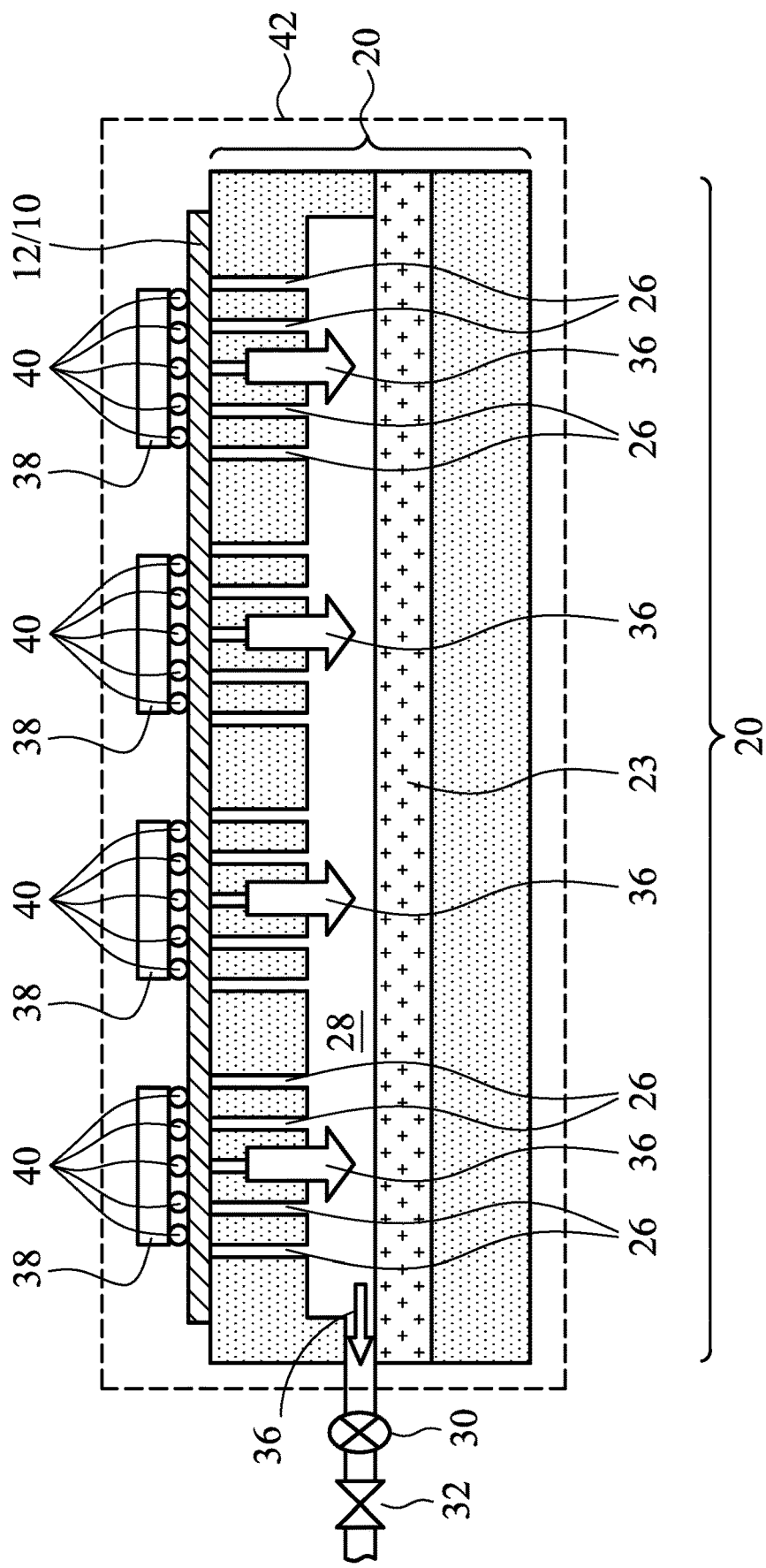
FIG. 3 illustrates a plurality of package components placed over another package component.

As shown in FIGS. 2A and 2B, air-penetration layer 24 may include a plurality of holes 26. Therefore, air passage 28 is connected to, and may exchange air with, external environment (for example, open air) through holes 26. Air passage 28 is also connected to outlet 29, which may be connected to external environment through pump 30 and valve 32. Outlet 29 is used to vacuum air passage 28 and holes 26 (when package substrate strip 10 is placed on air-penetration layer 24, as shown in FIGS. 3 and 4) to generate a vacuum environment. Valve 32 is also used to release vacuum by allowing air to flow into air passage 28 and holes 26. In some embodiments, an additional valve (not shown) may be connected to air passage 28, and hence valve 32 may be used for vacuuming, while the additional valve may be used for releasing the vacuum.

FIG. 2B illustrates a cross-sectional view of vacuum boat 20 in accordance with alternative embodiments. In these embodiments, thermal insulation layer 23 is formed as a top portion of air-penetration layer 24. Holes 26 are formed in thermal insulation layer 23, and penetrate into a bottom portion of air-penetration layer 24, which is below thermal insulation layer 23. The lower portion of air-penetration layer 24 may be formed of a rigid material such as a metal, a metal alloy, a ceramic, or the like, so that the lower portion provides adequate mechanical support to thermal insulation layer 23. When vacuum boat 20 in FIG. 2B is used to bond package substrate strip 10 and package components 38 (FIGS. 3 and 4), package substrate strip 10 may be in contact with thermal insulation layer 23 in these embodiments, and hence the heat in package substrate strip 10 and solder regions 40 (FIGS. 3 and 4) is not conducted into the base 22 of vacuum boat 20.

Figure 2C:
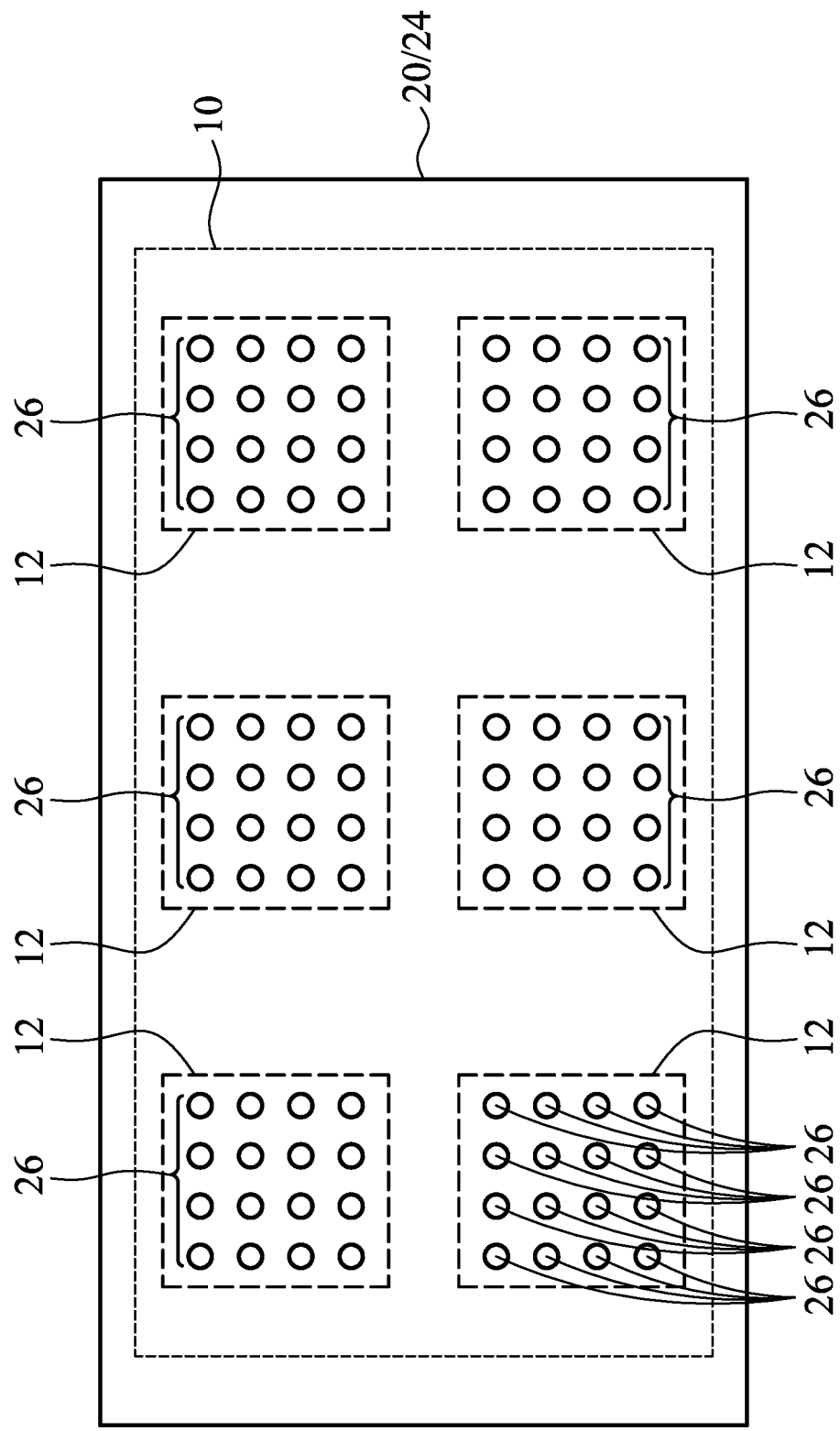
FIG. 2C is a top view of the vacuum boats in FIGS. 2A and 2B.

FIG. 2C illustrates an exemplary top view of the structure shown in FIGS. 2A and 2B. It illustrates a plurality of holes 26 distributed throughout air-penetration layer 24. The plurality of holes 26 may be distributed substantially uniformly, for example, as an array, or in any other pattern such as a radius pattern, a spiral pattern, or the like. FIG. 2C also illustrates package substrate strip 10 that is to be placed on air-penetration layer 24, wherein package substrate strip 10 is illustrated using dotted lines. Air-penetration layer 24 may have a rectangular top-view shape, although other shapes may also be adopted.

In FIGS. 3 and 4, although pump 30 and or valve 32 are illustrated as being attached to vacuum boat 20, pump 30 and valve 32 may be connected to vacuum boat 20 before the reflow process as shown in FIG. 4, and disconnected from vacuum boat 20 after the reflow process. Furthermore, in FIGS. 3 and 4, the vacuum boat 20 in FIG. 2A is illustrated to explain the concept of the embodiments. The vacuum boat 20 in FIGS. 3 and 4, however, may also adopt the structure shown in FIG. 2B.

Referring to FIG. 3, package substrate strip 10 is placed over vacuum boat 20. Holes 26 are covered by, and sealed by, package substrate strip 10. Pump 30 then evacuates the air in air passage 28 and holes 26 to generate vacuum therein. Arrows 36 represent the direction that the air is evacuated. During the vacuuming, a downward force is applied to package substrate strip 10 due to the air pressure caused by the vacuum, and hence package substrate strip 10 is flattened. During the vacuuming, the pressure in air passage 28 and holes 26 may be at any value lower than an atmosphere. For example, the pressure in air passage 28 may be lower than about 50 percent of one atmosphere. Package components 38 are placed over package substrate 12, for example, with a one-to-one correspondence. Solder regions 40 are disposed between package substrates 12 and package components 38. The placement of package components 38 on package substrate strip 10 may be performed before or after the vacuuming is started. In some embodiments, package components 38 are dies (such as device dies comprising CMOS devices), packages, or the like. Throughout the description, vacuum boat 20, package substrates 12, and package components 38 in combination are referred to as reflow unit 42.

Next, as shown in FIG. 4, reflow unit 42 goes through a reflow process, so that solder regions 40 are reflowed, and hence package components 38 are bonded to the respective underlying package substrates 12. In some exemplary embodiments, the reflow is performed using a convection-type reflow apparatus, as shown in FIG. 4. For example, the reflow process may be performed in chamber 50. Reflow unit 42 is transferred by conveyor belt 44 into and out of chamber 50. During the reflow, conveyor belt 44 and reflow unit 42 move forward, as indicated by arrows 46. It is appreciated that other types of reflow methods other than the convection-type reflow may also be used to perform the reflow, in accordance with alternative embodiments. As shown in FIG. 4, a plurality of reflow units 42 may be disposed on conveyor belt 44, and are transferred into and out of chamber 50 one by one. Reflow units 42 are removed from conveyor belt 44 after they are transferred out of chamber 50, and additional reflow units 42, which include package components 38 and package substrates 12 that have not bonded to each other yet, are placed on conveyor belt 44.

During the reflowing, conveyor belt 44 transfers reflow unit 42 through one or more heating zones, each including one or more heat sources 48 for heating solder regions 40. When reflow unit 42 is transferred passing heat sources 48, solder regions 40, which are between package components 38 and the underlying package substrates 12, are heated to a temperature higher than the melting temperature of solder regions 40, and hence solder regions 40 are molten. In some embodiments, heat sources 48 are disposed over and/or under reflow unit 42 (and conveyor belt 44). Heat sources 48 may be radiation-type heating sources such as infrared radiant sources, or may be configured to blow hot air to reflow unit 42. The arrows pointed away from heat sources 48 symbolize the radiated heat, the hot air, or the like.

Throughout the reflow process, pump 30 operates to maintain the air pressure on package substrates 12 through the generation of the vacuum. The pumping of air may be started at one of several time points. For example, the pumping may be started after package substrate strip 10 is placed on vacuum boat 20, and before or after the placement of package components 38. In alternative embodiments, the pumping may also be started after the placement of reflow unit 42 on conveyor belt 44, and before solder regions 40 are molten. In yet alternative embodiments, the pumping may also be started after the molten of solder regions 40, and before the solidification of solder regions 40. The vacuum is maintained until the reflow process ends. By then, solder regions 40 are cooled and at least substantially, or fully, solidify. Package components 38 are thus bonded to the underlying package substrates 12. The vacuum may then be released, for example, by allowing air to be conducted into air passage 28, which may be achieved through valve 32. Pump 30 may then be disconnected from vacuum boat 20.

In some embodiments, pumps 30 in different reflow units 42 may be separate pumps. In alternative embodiments, the illustrated pumps 30 may be the same pump that has a plurality of inlets, each connected to one of reflow units 42.

In the embodiments, during the reflow process, package substrates 12 are flattened by the pressure caused by the vacuum in air passage 28 and holes 26 (FIGS. 3 and 4). Accordingly, the warpage of package substrates 12, which warpage is caused by the difference in Coefficients of Thermal Expansion (CTEs) of different materials in package components 38 and package substrates 12, is substantially eliminated. The reliability of the resulting packages is improved.

In accordance with embodiments, a method includes placing a first package component over a vacuum boat, wherein the vacuum boat comprises a hole, and wherein the first package component covers the hole. A second package component is placed over the first package component, wherein solder regions are disposed between the first and the second package components. The hole is vacuumed, wherein the first package component is pressed by a pressure against the vacuum boat, and wherein the pressure is generated by a vacuum in the hole. When the vacuum in the hole is maintained, the solder regions are reflowed to bond the second package component to the first package component.

In accordance with other embodiments, a method includes placing a package substrate strip over a vacuum boat, wherein the vacuum boat includes a plurality of holes, and wherein the package substrate strip covers the plurality of holes. A plurality of package components is placed over the package substrate strip, wherein each of the plurality of package components is placed over one of package substrates in the package substrate strip. Air is pumped out of the plurality of holes to generate a pressure on the package substrate strip, wherein the pressure presses the package substrate strip against the vacuum boat. Solder regions between the plurality of package components and the package substrates are reflowed to bond the plurality of package components to the package substrates, wherein the step of pumping air is performed until the solder regions substantially solidify.

In accordance with yet other embodiments, a vacuum boat includes a base that includes an upper portion forming a ring, and a lower portion under the upper portion, wherein the upper portion is connected to edges of the lower portion. The vacuum boat further includes an air-penetration layer over and connected to the upper portion of the base. The air-penetration layer, the upper portion, and the lower portion enclose an air passage therebetween. A plurality of holes penetrates through the air-penetration layer, wherein the plurality of holes connects the air passage to an external environment. A thermal insulation layer is disposed over the lower portion of the base. An outlet is connected to the air passage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a package substrate strip over a vacuum boat, wherein the vacuum boat comprises:
   an air-penetration layer;
   a thermal insulation layer over the air-penetration layer, wherein the package substrate strip is in contact with the thermal insulation layer, and the package substrate strip covers a plurality of through-holes that penetrate through the air-penetration layer and the thermal insulation layer;
   a first portion disposed below the air-penetration layer, wherein an inner space in the vacuum boat is disposed between the first portion and the air-penetration layer; and
   a second portion that comprises a ring, wherein the second portion encircles the inner space, and wherein the second portion is in physical contact with the first portion and the air-penetration layer;
   vacuuming the plurality of through-holes; and
   performing a reflow process to reflow solder regions over the package substrate strip while vacuuming the plurality of through-holes.

2. The method of claim 1 further comprising placing a plurality of package components over the package substrate strip, wherein after the reflow process, the solder regions join the package substrate strip with the plurality of package components.

3. The method of claim 1, wherein vacuuming the plurality of through holes comprises vacuuming the inner space in the vacuum boat, with the inner space being connected to the plurality of through-holes.

4. The method of claim 1, wherein vacuuming the plurality of through-holes is maintained until the solder regions solidify after the reflow process.

5. The method of claim 1, wherein the reflow process is performed using a convection-type reflow process with the vacuum boat being transferred on a conveyor belt.

6. The method of claim 5, wherein when the vacuum boat is transferred on the conveyor belt, a pump is operated to vacuum the plurality of through-holes.

7. The method of claim 1, wherein the plurality of through-holes is grouped into a plurality of groups, with inner-group spacing between through-holes in a same group being smaller than inter-group spacing between neighboring groups of the plurality of groups.

8. A method comprising:
placing a first package component over a vacuum boat, wherein the vacuum boat comprises:
   a thermal insulation layer in physical contact with the first package component;
   an air-penetration layer below the thermal insulation layer; and
   a base portion underlying and overlapped by the air-penetration layer, wherein an air-passage is disposed between the base portion and the air-penetration layer, and wherein holes that extend through the thermal insulation layer and the air-penetration layer are connected to and exchange air with the air-passage;
decreasing pressure in the air-passage to be lower than one atmosphere;
placing a plurality of second package components over the first package component; and
when the pressure in the air-passage is lower than one atmosphere, reflowing solder regions to couple the plurality of second package components to the first package component.

9. The method of claim 8, wherein decreasing pressure in the air-passage comprises connecting a pump to and vacuuming the air-passage.

10. The method of claim 9, wherein a vacuum in the air-passage is maintained until the reflowing the solder regions is complete.

11. The method of claim 9, wherein the vacuuming of the air-passage is started after placing the plurality of second package components over the first package component.

12. The method of claim 9, wherein the vacuuming of the air-passage is started before placing the plurality of second package components over the first package component.

13. The method of claim 8, wherein during the reflowing the solder regions, the vacuum boat, the first package component, and the plurality of second package components are moved by a conveyor belt.

14. The method of claim 8, wherein a material of the thermal insulation layer is different from a material of the air-penetration layer.

15. A method comprising:
placing a package substrate strip over a vacuum boat, wherein the vacuum boat comprises:
   a rigid layer, wherein the rigid layer comprises a plurality of through-holes that penetrate through the rigid layer;
   a first portion vertically spaced apart from the rigid layer by an air passage, wherein the air passage is connected to the plurality of through-holes;
   a second portion that comprises a ring, wherein the second portion encircles the air passage and is in physical contact with the rigid layer; and
   a thermal insulation layer comprising a ceramic;
connecting a valve and a pump to the vacuum boat in series, the pump being between the valve and the vacuum boat;
evacuating air from the plurality of through-holes and the air passage using the pump;
placing a plurality of package components over the package substrate strip; and
conveying the vacuum boat, the package substrate strip, and the plurality of package components through a heating zone.

16. The method of claim 15, wherein the thermal insulation layer is disposed above the air passage.

17. The method of claim 15, wherein the thermal insulation layer is disposed below the air passage.

18. The method of claim 15, wherein during conveying the vacuum boat, the package substrate strip, and the plurality of package components through the heating zone, solder regions are reflowed to join the plurality of package components to the package substrate strip.

19. The method of claim 18, wherein during conveying the vacuum boat, the package substrate strip, and the plurality of package components through the heating zone, the reflowing of the solder regions is performed using a convection-type reflow process, with the vacuum boat being transferred on a conveyor belt.

20. The method of claim 15, wherein the thermal insulation layer is in physical contact with a top surface of the rigid layer.

* * * * *